(12) United States Patent
Archer et al.

(10) Patent No.: US 10,977,396 B2
(45) Date of Patent: Apr. 13, 2021

(54) DETERMINING AN ELASTIC MODEL FOR A GEOLOGIC REGION

(75) Inventors: Stewart Archer, Hays Heath (GB);
Robin Fletcher, Guildford (GB);
Weijian Mao, Kingston Upon Thames (GB); David Nichols, Palo Alto, CA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 1277 days.

(21) Appl. No.: 13/589,478

(22) Filed: Aug. 20, 2012

(65) Prior Publication Data

US 2013/0185032 A1    Jul. 18, 2013

Related U.S. Application Data

(60) Provisional application No. 61/619,882, filed on Apr. 3, 2012, provisional application No. 61/586,512, filed on Jan. 13, 2012.

(51) Int. Cl.
*G06F 30/20*      (2020.01)
*G01V 1/30*       (2006.01)
*G01V 1/42*       (2006.01)

(52) U.S. Cl.
CPC .............. *G06F 30/20* (2020.01); *G01V 1/306* (2013.01); *G01V 1/42* (2013.01)

(58) Field of Classification Search
None
See application file for complete search history.

(56) References Cited

U.S. PATENT DOCUMENTS

| | | | |
|---|---|---|---|
| 4,935,904 A * | 6/1990 | Chambers et al. | ............. 367/38 |
| 5,173,880 A | 12/1992 | Duren et al. | |
| 5,392,255 A | 2/1995 | LeBras et al. | |
| 6,081,765 A | 6/2000 | Ziolkowski | |
| 6,240,370 B1 | 5/2001 | Sonneland et al. | |
| 7,376,539 B2 | 5/2008 | Lecomte | |
| 7,676,327 B2 | 3/2010 | Ozdemir et al. | |
| 8,456,951 B2 | 6/2013 | Soubaras | |
| 2005/0046612 A1 | 3/2005 | Blunt et al. | |
| 2005/0088913 A1* | 4/2005 | Lecomte | ................ G01V 1/282 367/51 |

(Continued)

FOREIGN PATENT DOCUMENTS

EP    0400769 A2    12/1990
EP    2395374 A1    12/2011

(Continued)

OTHER PUBLICATIONS

Stanford Exploration Project, Kirchhoff modeling and migration, Oct. 21, 1998, Stanford University, pp. 1.*

(Continued)

*Primary Examiner* — Omar F Fernandez Rivas
*Assistant Examiner* — Bernard E Cothran
(74) *Attorney, Agent, or Firm* — Michael Guthrie

(57) ABSTRACT

A technique includes determining at least one impulse response of a modeling and migration of at least one point scatterer in a target structure and based at least in part on the impulse response(s) and a reflection amplitude image, determining a model for at least part of the target structure.

15 Claims, 4 Drawing Sheets

(56) References Cited

U.S. PATENT DOCUMENTS

| | | | |
|---|---|---|---|
| 2005/0090986 A1* | 4/2005 | Van Riel | G01V 1/30 702/6 |
| 2005/0207278 A1* | 9/2005 | Reshef et al. | 367/38 |
| 2005/0232077 A1* | 10/2005 | Marmalyevskyy | G01V 1/28 367/47 |
| 2007/0203673 A1* | 8/2007 | Sherrill et al. | 702/189 |
| 2009/0030616 A1* | 1/2009 | Sugiura | G01V 11/00 702/9 |
| 2009/0251992 A1 | 10/2009 | Borselen et al. | |
| 2009/0323471 A1 | 12/2009 | Wang | |
| 2009/0326895 A1 | 12/2009 | Beasley | |
| 2010/0270026 A1* | 10/2010 | Lazaratos et al. | 166/369 |
| 2011/0103187 A1* | 5/2011 | Albertin | G01V 1/28 367/73 |
| 2011/0267923 A1* | 11/2011 | Shin | 367/49 |
| 2011/0292762 A1 | 12/2011 | Ozdemir et al. | |
| 2013/0279290 A1 | 10/2013 | Poole | |
| 2013/0308420 A1 | 11/2013 | Soubaras | |
| 2015/0276957 A1 | 10/2015 | Caprioli et al. | |

FOREIGN PATENT DOCUMENTS

| | | |
|---|---|---|
| FR | 2955396 B1 | 7/2011 |
| WO | 9607935 A1 | 3/1996 |

OTHER PUBLICATIONS

Gray, True-amplitude seismic migration: A comparison of three approaches, Jun. 1997, Society of Exploration Geophysicsts, vol. 62 No. 3, pp. 929-936.*

Dictionary.com, Definition of interface, 2017, Dictionary.com, pp. 1-5.*

Stewart et al., Relationship among elastic-waves values (Rpp, Rps, Rss, Vp, Vs, p, δ, κ, 1995, CREWES Research Report, vol. 7, pp. 10-1-10-9 (Year: 1995).*

Stanford University, ADCIG methods, 2001, Stanford University, pp. 1-3 (Year: 2001).*

Blackledge, Point Spread Function, 2005, ScienceDirect, pp. 1-18 (Year: 2005).*

Anderson et al., Forward Seismic Modeling: The Key to Understanding Reflection Seismic and Ground Penetrating Radar (GPR) Techniques, 2012, University of Missouri-Rolla, pp. 1-21 (Year: 2012).*

Datcu et al., Focal plane array infrared camera transfer function calculation and image restoration, 2004, Society of Photo-Optical Instrumentation Engineers, vol. 43(3), pp. 648-657 (Year: 2004).*

Nemeth, T., Wu, C., and Schuster, G. T., "Least-squares migration of incomplete reflection data", Geophysics, Jan. 1999, vol. 64(1): pp. 208-221.

Ma, X-Q., "Simultaneous inversion of prestack seismic data for rock properties using simulated annealing", Geophysics, Nov. 2002, vol. 67(6): pp. 1877-1885.

Rasmussen, K. B., Bruun, A., and Pedersen, J. M., "Simultaneous Seismic Inversion", EAGE 66th Conference and Exhibition, Jun. 2004: pp. 1-4.

Toxopeus, G., Thorbecke, J., Wapenaar, K., Petersen, S., Slob, E., and Fokkema, J., "Simulating migrated and inverted seismic data by filtering a geologic model", Geophysics, Mar. 2008, vol. 73(2): pp. T1-T10.

Lecomte, I., "Resolution and illumination analyses in PSDM: A ray-based approach", The Leading Edge, May 2008, vol. 27(5): pp. 650-663.

Ayeni, G. and Biondi, B., "Least-squares wave-equation inversion of time-lapse seismic data sets—Valhall case study", Stanford Exploration Project 145, 2011: pp. 1-15.

Tang, Y. and Biondi, B., "Subsalt imaging by target-oriented wavefield least-squares migration: A 3-D field data example", Stanford Exploration Project 143, 2011: pp. 1-27.

International Search Report and Written Opinion of PCT Application No. PCT/US2013/021191 dated Apr. 29, 2013: pp. 1-10.

Supplementary European Search Report issued in related EP Application No. 13735884.2 dated Jan. 8, 2016 (4 pages).

Communication issued in related EP Application No. 13735884.2 dated Jan. 27, 2016 (6 pages).

Official Action issued in related MX Application No. MX/a/2014/008360 dated Jan. 27, 2016, with partial English translation by Agent (5 pages).

Toxopeus et al, "Simulating migrated seismic data by filtering an earth model: A Matlab implementation", Computers & Geosciences, 2010, vol. 36, No. 2, pp. 195-204.

Office Action for the equivalent Mexican patent application MX/a/2014/008360 dated Apr. 25, 2016.

Communication pursuant to Article 94(3) for the equivalent European patent application 13735884.2 dated Nov. 15, 2016.

VanDerNeut, et al., "Deghosting, Demultiple, and Deblurring in Controlled-Source Seismic Interferometry," International Journal of Geophysics, vol. 75, No. 3, Jan. 1, 2011, pp. 1-28.

Vasconcelos, et al., "Broadband extended images by joint inversion of multiple blended wavefields," Geophysics, vol. 18, No. 2, Mar.-Apr. 2013, pp. WA147-WA158.

Extended Search Report for the cross referenced European patent application 15774067.1 dated Nov. 2, 2017.

International Preliminary Report on Patentability for the cross referenced International patent application PCT/US2015/023577 dated Oct. 13, 2016.

International Search Report and Written Opinion for the cross referenced International patent application PCT/US2015/023577 dated Jul. 2, 2015.

* cited by examiner

DETERMINING AN ELASTIC MODEL FOR A GEOLOGIC REGION

This application claims the benefit of U.S. Provisional Patent Application Ser. No. 61/619,882 filed Apr. 3, 2012 and U.S. Provisional Patent Application Ser. No. 61/586,512 filed Jan. 13, 2012; both or which are hereby incorporated by reference in their entireties.

BACKGROUND

Seismic exploration may be used in many different applications, such as applications involving surveying subterranean geologic formations for hydrocarbon deposits. In a survey, one or more seismic source(s) generate seismic waves, which propagate into the geologic formations creating pressure changes and vibrations along their way. Changes in elastic properties of the geologic formations scatter the seismic waves, changing their direction of propagation and other properties. Part of the energy emitted by the sources reaches seismic sensors, resulting in measurements that are acquired by the sensors. Some seismic sensors are sensitive to pressure changes (hydrophones), others to particle motion (e.g., geophones); and industrial surveys may deploy only one type of sensor, both hydrophones and geophones; and/or other suitable sensor types. Time-domain based seismic amplitude inversion has been used to derive an estimate of the elastic rock properties of the surveyed geologic formations.

SUMMARY

The summary is provided to introduce a selection of concepts that are further described below in the detailed description. This summary is not intended to identify key or essential features of the claimed subject matter, nor is it intended to be used as an aid in limiting the scope of the claimed subject matter.

In accordance with example implementations, a technique includes determining at least one impulse response of a modeling and migration of at least one point scatterer for a subsurface geologic region of interest. The technique includes determining an elastic model for the region, based at least in part on the impulse response(s) and a reflection amplitude image of the region.

In further example implementations, the technique includes inverting the reflection amplitude image in the depth domain.

In further example implementations, the inversion of the reflection amplitude image includes directly inverting the image in the depth domain without first transforming the image into another domain other than the depth domain.

In further example implementations, the reflection amplitude image includes an image that is formed from pre-stack seismic data.

In further example implementations, determining the elastic model includes simultaneously inverting a plurality of images, which are derived from pre-stack data for the elastic model.

In further example implementations, images may include images derived from pre-stack data selected according to at least one of opening angles, offsets and reflection azimuths.

In further example implementations, the technique includes migrating data acquired by at least one receiver in a seismic survey to generate the reflection amplitude image based at least in part on a velocity model for the region; and determining an estimate of the elastic model. This is achieved at least in part by using the impulse response(s) and the estimated elastic model, to estimate the modeled reflection amplitude image of the subsurface geologic region. This determination includes selectively refining the estimated elastic model based at least in part on a comparison of the images.

In further example implementations, determining the modeled reflection amplitude image includes determining the reflectivity of the point(s) based at least in part on an estimate of the elastic model; and determining the modeled reflection amplitude image based at least in part on the determined reflectivity and the impulse response(s).

In further example implementations, selectively refining the estimated elastic model includes modifying the elastic model to decrease a difference between the images.

In further example implementations, determining the modeled reflection amplitude image includes determining a reflectivity based at least in part on the estimated elastic model, and applying one of the impulse response(s) that is a Hessian operator, a blurring operator or a point spread function (PSF) to the determined reflectivity.

In further example implementations, the technique includes selectively correcting at least one of the images based at least in part on a well log-derived image.

In another example implementation, an apparatus includes an interface and a processor. The interface receives seismic data acquired in a survey of a subsurface geologic region. The at least one impulse response of a modeling and migration of at least one point scatterer for the region; and determines an elastic model for the region based at least in part on the impulse response(s) and a reflection amplitude of the image.

In another example implementation, a technique includes determining at least one impulse response of a modeling and migration of at least one point scatterer of a target structure and based at least in part on the impulse response(s) and a reflection amplitude image, determining a model for at least part of the target structure.

In another example implementation, an article includes a non-transitory storage medium to store instructions that when executed by a processor-based machine cause the processor-based machine to determine at least one impulse response of a modeling and migration of at least one point scatterer of a target structure and determine a model for at least part of the target structure based at least in part on the impulse response(s) and a reflection amplitude image.

Advantages and other features will become apparent from the following drawing, description and claims.

DETAILED DESCRIPTION

Figure 1:
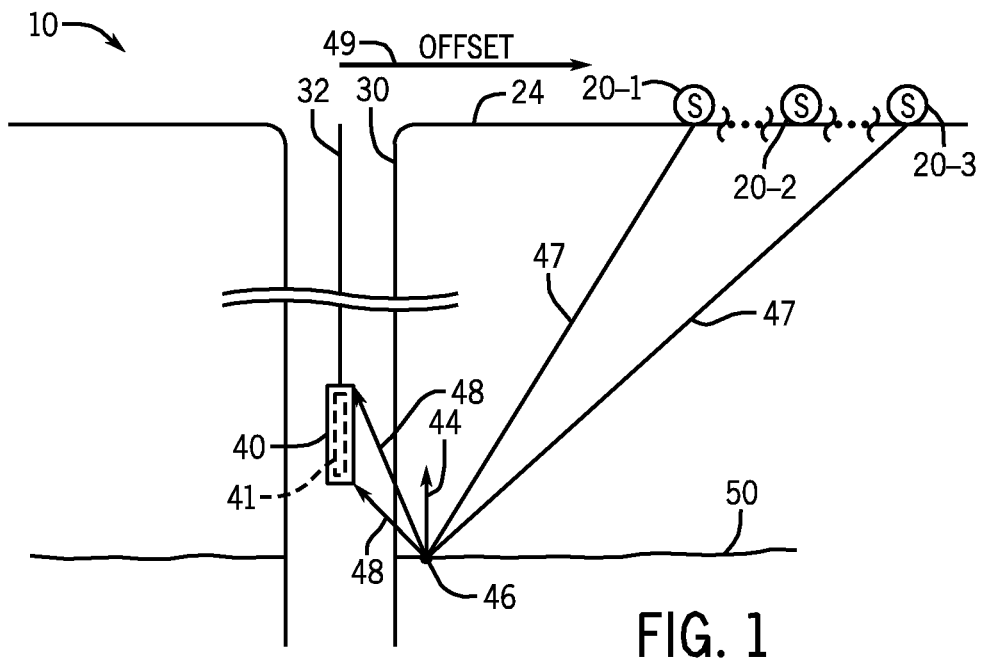
FIG. 1 is a schematic diagram of a seismic acquisition system according to an example implementation.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description herein is for the purpose of describing particular embodiments only and is not intended to be limiting of the invention. As used in the description and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises" and/or "comprising," when used in this specification, specify the presence of stated features, integers, steps, operations, elements and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Seismic data may be processed in a technique called "depth imaging" to form an image (herein called the "depth image") of reflection amplitudes in the depth domain for a particular target structure (a geologic subsurface region of interest, for example). In general, for processing seismic data surveying a geologic subsurface region of interest, the depth image may be used to identify the reservoir structure of this region. The seismic data may also be processed to obtain information (herein called the "elastic model") about the elastic properties of the geologic subsurface region, such as density, compressional (P) impedance, compression velocity ($v_p$)-to-shear velocity ($v_s$) ratio, anisotropy and so forth. In general, the elastic model provides insight into the surveyed region's lithology, reservoir quality and fluids.

One way to determine the elastic model involves using seismic amplitude versus offset (AVO) inversion. With AVO inversion, the depth image has traditionally been converted into the time domain so that the resulting time domain data may be convolved with a consistent wavelet, which spatially and temporally varies relatively slowly; and the resulting processed data has subsequently been transformed back into the depth domain.

In accordance with example implementations, techniques and systems are disclosed herein for purposes of determining an elastic model for a subsurface geologic region of interest in the depth domain without involving transformations between the time and depth domains, thereby saving time, expense, and effort. More particularly, techniques and systems are disclosed herein, which determine the elastic model based at least in part on the depth image and impulse responses of a combined modeling and migration of selected point scatterers in the region. In general, the impulse response is the response of the modeling and migration of a single point scatterer and may be a blurring operator, Hessian operator or point spread function (PSF), as further described herein. This approach of determining the elastic model accounts for the variations in the reflection amplitudes, which arise due to such factors as complex geology, spatial variations in the acquisition geometry and processing system imperfections.

Although techniques and systems that are disclosed herein permit the determination of the elastic model in the depth domain without conversions between the time and depth domains, domains other than the depth domain (the time domain, the phase domain, and so forth) and thus, one or more transformations may be used to determine the elastic model, in accordance with further implementations.

In accordance with example implementations that are disclosed herein, the elastic model is determined by an inversion process that is based on a comparison of a first depth image that is derived from actual seismic measurements with a synthetically-generated second depth image that is derived using the impulse responses and the first depth image.

The seismic acquisition system that acquires the actual seismic measurements may take on numerous different forms and configurations, depending on the particular implementation. As a non-limiting example, FIG. 1 depicts an example seismic acquisition system 10, although other seismic acquisition systems and/or other survey geometries may be employed, in accordance with other implementations. Moreover, although the system 10 is a land-based seismic acquisition system that includes at least one well 30, it is understood that the techniques and systems, which are disclosed herein may likewise be applied to seabed-based seismic acquisition systems, towed streamer-based seismic acquisition systems, and so forth, regardless of whether such systems include any well or more than one well. Thus, many variations are contemplated, which are within the scope of the appended claims.

For the specific example that is depicted in FIG. 1, the seismic acquisition system 10 employs a multi-receiver borehole seismic (BHS) geometry (employs a vertical seismic profile (VSP) survey geometry, as a non-limiting example) in which an array of seismic receivers (in the form of a "receiver array 41") is deployed in the well 30 or at other suitable region or regions for seismic surveying and analysis. Moreover, for the example that is depicted in FIG. 1, the seismic acquisition system 10 includes one or more seismic sources 20 (example seismic sources 20-1, 20-2 and 20-3, being depicted in FIG. 1), which are disposed at or near the Earth surface 24 of the well 30 at various lateral source-to-receiver offsets from the receiver array 21. As a non-limiting example, the seismic receivers of the receiver array 41 may be formed on an optical fiber. It is noted, however, that the seismic receivers may take on various different forms, such as discrete receivers that are deployed on a cable, and so forth, as can be appreciated by the skilled artisan.

In further implementations, the seismic acquisition system may include multiple wells, with each well having a similar arrangement of receivers and sources. In yet further implementations, the seismic acquisition system may include additional receivers and/or sources located outside/away from any wellbores.

For the example that is depicted in FIG. 1, the seismic sources 20 are disposed at different positive source-to-receiver offsets (relative to an offset direction 49). However, the seismic sources 20 may be deployed at negative source-to-receiver offsets, in accordance with further implementations. In general, the seismic sources 20 may be arbitrarily distributed in three-dimensional (3-D) space, in accordance with the many possible implementations. The actual number of seismic sources 20 that are used, the locations of the seismic sources 20 and the source spacing, which is employed, depends on the particular implementation. As shown in FIG. 1, for a given image point 46 (at an example interface boundary 50) the seismic sources 20 generates energy that propagates along different paths 47 and produces reflected energy 48, which is sensed by the receivers of the array 41.

As depicted in FIG. 1, the receiver array 41 may be deployed downhole in the well 30 as part of a tool 40 via a conveyance mechanism 32. As a non-limiting list of examples, the conveyance mechanism 32 may be a wireline, a slickline, a coiled tubing, or jointed tubing, as non-limiting examples. In accordance with some implementations, the receiver array 41 may include two or more seismic receiver sub arrays, where each seismic receiver sub array has one or more seismic receivers. In accordance with some implementations, the receiver array 41 may be deployed for seismic acquisition using a plurality of tools and/or a plurality of conveyance mechanisms. Moreover, in accordance with some implementations, the receiver array 41 may include a plurality of seismic receiver sub arrays, where a first seismic receiver sub array in the plurality of seismic receiver sub arrays is deployed in a first seismic survey region, a second receiver sub array is deployed in a second seismic survey region, and so forth. Thus, many variations are contemplated, which are within the scope of the appended claims.

For example techniques and systems, which are disclosed herein, it is assumed that a logging operation has been performed in the well 30 to obtain near wellbore logging measurements that provide or may be processed to provide elastic properties in the near wellbore region. As can be appreciated by the skilled artisan, various tools may be deployed in the well 30 for purposes of acquiring these measurements, such as nuclear magnetic resonance (NMR) tools, impedance tools, acoustic tools and so forth.

Conventional AVO inversion processes the depth image and assumes that the depth image has preserved relative amplitude information and is relatively free from the effects of illumination variations, vertically, laterally, with incidence angle and with azimuth. Under these assumptions, stretching a depth image back to time and applying inversion based on a one-dimensional (1-D) convolutional modeling approach may produce reasonable results. However, illumination effects in complex geological settings (settings that involve shadow zones in subsalt imaging, for example) may pose challenges to traditional imaging algorithms, such as reverse-time migration (RTM). In accordance with the techniques and systems, which are disclosed herein, the impulse responses used in the derivation of the elastic model provide a measure of how well the migration processing operation serves as an inverse to the Earth's response.

Seismic data d may be regarded to be the result of the application of a linear modeling operator M to a reflectivity model r. The linear modeling operator M may be a discrete or continuous (i.e., integral) operator, depending on the particular implementation. The least-squares inverse to this problem (deriving a reflectivity model $\hat{r}$) is set forth below:

$$\hat{r}=(M^*M)^{-1}M^*d, \qquad \text{Eq. 1}$$

where M* represents the migration operator, which is the adjoint of modeling operator, M. The resulting migrated depth image, I, is described as follows:

$$I=M^*d, \qquad \text{Eq. 2}$$

The true reflectivity model r is related to the migrated depth image I as follows:

$$I=Hr, \qquad \text{Eq. 3}$$

where H represents the Hessian operator and may be further described as follows:

$$H=M^*M. \qquad \text{Eq. 4}$$

In general, the Hessian operator H may be viewed as a measure of illumination that reflects the effects of velocity variation and the acquisition footprint.

More specifically, in accordance with example implementations, which are described herein the processing and migration operator, P, may include the effects of applied processing and imaging methods and may differ in some details from the adjoint of the modeling operator, such that the depth image is described as follows:

$$I=Pd=Br=PMr, \qquad \text{Eq 5}$$

where $$B=PM, \qquad \text{Eq 6}$$

and B may differ in some details from the Hessian of the modeling operator.

The operator B may be alternatively viewed as being a modeling operation followed by a migration operation. In general, the operator B may be regarded as an operator, which "blurs" the true reflectivity model r to provide the migrated depth image I.

Each column of the operator B is the result of applying the modeling operation, M, followed by the processing and imaging operator, P to the corresponding point in r. This defines a multi-dimensional blurring function at that point scatterer which we will also refer to as a point spread function or PSF.

Applying the operator B may be a relatively processing intensive operation, and therefore, in accordance with some implementations, measures may be undertaken to regulate the number of calculations used in this operation. For example, in accordance with some implementations, the operator B may be relatively slow varying spatially, and due to this characteristic, the operator B may be applied in the wavenumber domain. As another example, in some implementations, when the operator B is relatively sparse (contains a significant number of zero or near zero values), the operator B may be applied by approximating the operator B using a low rank approximation, such as an eigenvalue-based approximation, for example. In this manner, in accordance with an example implementation, the operator B may be approximated using an eigen-decomposition of the operator B.

In accordance with the systems and techniques, which are disclosed herein, a simulated, or synthetic, depth image that is formed from the operator B and an estimated elastic model, m, is compared with the migrated depth image I (i.e., compared with the depth image derived from the actual seismic measurements); and this comparison is used to further refine and thus, determine the final elastic model, m, in an inversion process.

More specifically, the true reflectivity, r, may be modeled as a function of the elastic model, m, as follows:

$$r=R(m). \qquad \text{Eq. 5}$$

Using this relationship, a synthetic depth image BR(m) may be compared with the migrated depth image I, such that comparisons may be performed in multiple processing iterations that refine the estimate for the model m. Therefore, when the synthetic image BR(m) is the same (or similar or substantially the same) as the migrated depth image I, based on predetermined matching criteria, a relatively accurate estimate of the elastic model m may be obtained.

Figure 2:
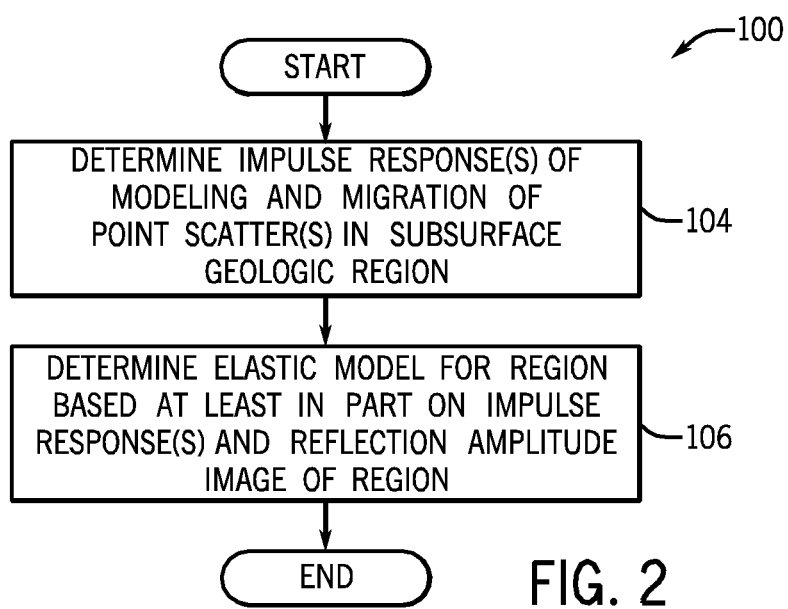
FIGS. 2 and 3 are flow diagrams depicting techniques to determine an elastic model according to example implementations.

Referring to FIG. 2, thus, in accordance with some implementations, a technique 100 to determine an elastic model for a subsurface geologic region of interest includes determining (block 104) at least one impulse response of a modeling and migration of at least one point scatterer in the region. The elastic model may be determined, pursuant to block 106, for the subsurface geologic region based at least in part on the impulse response(s) and a reflection amplitude image, i.e., the migrated depth image I that is derived from actual seismic measurements acquired in a seismic survey of the region.

In general, in accordance with example implementations disclosed herein, the elastic model parameters may be determined by simultaneously inverting a plurality of images that are derived from pre-stack data. These pre-stack images may be selected according to opening angles, offsets and reflection azimuths; and, in general, the inversion may be based on at least one of these images or a combination of one or more of these images. Thus, many variations are contemplated, which are within the scope of the appended claims.

In accordance with example implementations, the above-described impulse responses provide an estimate of the operator B by modeling scattering points of the depth image (using the adjoint of the reverse time migration (RTM) used to derive the migrated depth image I, for example) and then applying the migration operation (the RTM operation, for example) to the modeled data. Thus, it is noted that the migration operation may, in accordance with example implementations, be the same operation (or similar or substantially the same) used to produce the migrated depth image I; and the modeling operation may be its adjoint. In this case the impulse responses would be the Hessian of the RTM modeling and migration. The impulse responses take into account non-ideal effects, which include the effects of acquisition geometry on the inversion; illumination effects on amplitudes and inversion; and/or the effects of processing on amplitudes and inversion.

In accordance with some implementations, the impulse response may be a point spread function (PSF), computed by means other than modeling and migration of a point scatterers. As a non-limiting example, the PSF for a point scatterer, may be determined using ray tracing, as forth in Lecomte, I., 2008, "RESOLUTION AND ILLUMINATION ANALYSES IN PSDM: A RAY-BASED APPROACH: THE LEADING EDGE," 27, no. 5, 650-663, which is hereby incorporated by reference, although the PSF may be determined using other techniques, in accordance with further implementations. Moreover, in accordance with yet other implementations, the impulse response may be derived using a technique that does not involve determining a PSF. Thus, many variations are contemplated, which are within the scope of the appended claims.

Other representations or approximations of impulse responses are also contemplated in some implementations, such as simplifications to consider only a one-dimensional (1D) approximation defined at at least one location in the model.

In some implementations the modeling operation in equations 3 and 5 may exploit the structure and sparseness of the operator B, or any low rank approximation to it.

For implementations that involve determining sparse impulse responses they may be "cut out" from the migrated depth image I and interpolated dynamically during application of the blurring operator (i.e., non-stationary convolution). As a non-limiting example, in accordance with some implementations, a reflection coefficient may be determined at each depth sample from the an elastic model and multiplied by the corresponding impulse response for that location such that these products may be added together to provide a forward modeled, synthetically generated depth image. For scattering locations in which impulse responses are not determined, they may be interpolated from scattering locations with impulse responses, in accordance with example implementations. Impulse responses may be determined at all locations without employing interpolation, in accordance with further implementations. Interpolation of impulse responses illustrates one way to reconstruct the complete blurring operator B in equation 6. Any means of constructing operator B is within the scope of the claimed subject matter.

Figure 3:
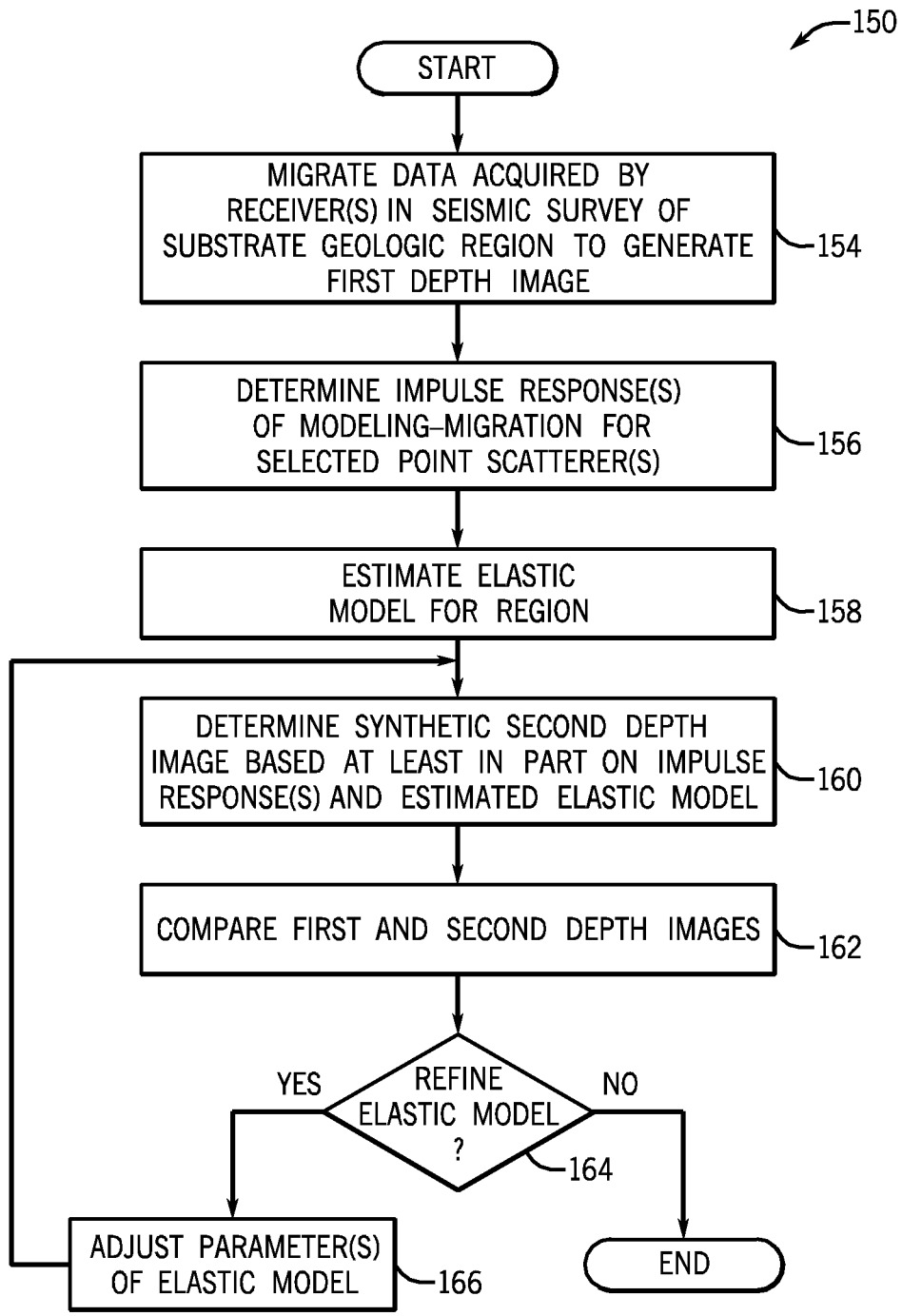

The elastic model, m, may be determined using the above-described synthetically-generated depth image and the migrated depth image I using a technique 150 that is depicted in FIG. 3. Referring to FIG. 3, pursuant to the technique 150, data acquired by at least one receiver of a seismic survey of a geologic region of interest are acquired (block 154) and migrated to generate a first depth image. Pursuant to the technique 150, at least one impulse response is determined from the modeling and migration for at least one selected scatterer point, pursuant to block 156. An initial estimate for the elastic model for the geologic region of interest is determined, pursuant to block 158.

The technique 150 next involves performing one or more iterations for purposes of refining the initial estimate for the elastic model m. In this manner, in accordance with some implementations, each iteration involves determining (block 160) a synthetic, second depth image based at least in part on the impulse response(s) and the estimated elastic model (i.e., the current version of the elastic model m). The iteration further includes comparing (block 162) the first and second depth images and determining (decision block 164) whether more refinement of the elastic model m is to be performed. If so, one or more parameters of the elastic model, m, are adjusted, pursuant to block 166, and control returns to block 160 for another iteration.

Figure 4:
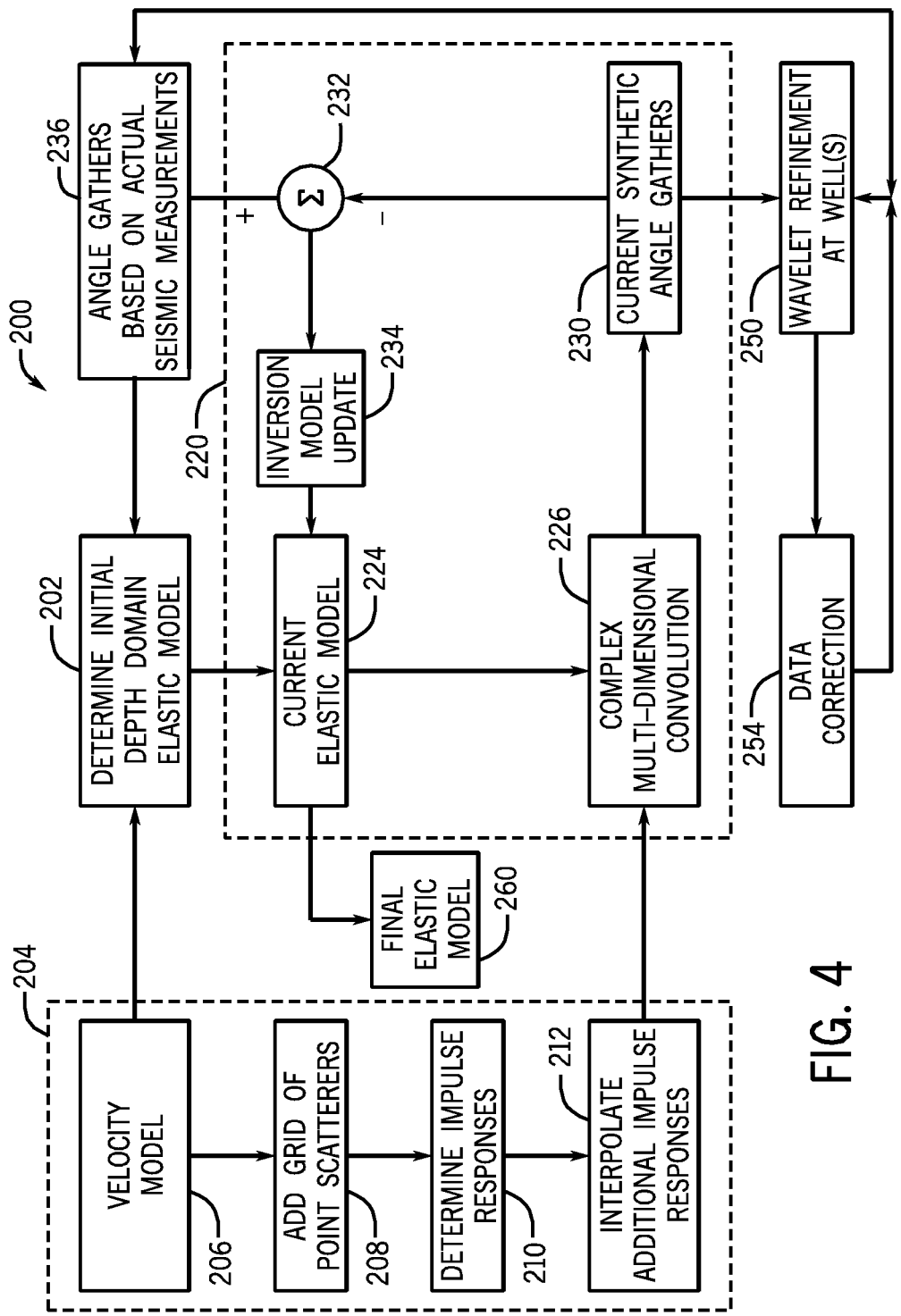
FIG. 4 is a schematic diagram of a system to determine an elastic model according to an example implementation.

As a more specific example, FIG. 4 depicts an example system 200 to determine a final elastic model 260 for a subsurface geologic region using actual seismic measurements acquired in a seismic survey of the region and well log data acquired in a logging operation in at least one well near or in the region. The system 200 includes a subsystem 204, which generates the impulse responses. In this regard, the subsystem 204 uses a velocity model 206 and adds (block 208) a grid of point scatterers for purposes of determining (block 210) impulse responses at the point scatterers. It is noted that the velocity model 206, in accordance with some implementations, is the same (or similar or substantially the same) velocity model used for purposes of performing migration to derive a depth image and the determination of the impulse responses takes into account the kernel of the migration operation (the kernel of an RTM operation, for example), as well as the velocity model 206.

The grid of point scatterers may not include all points of the depth image. Therefore, in accordance with some implementations, the subsystem 204 interpolates (block 212) the corresponding additional impulse responses. Regardless of whether interpolation is used or not, however, the impulse responses determined by the subsystem 204 are provided to a system 220, which performs one or more iterations for purposes of determining the final elastic model 260.

More specifically, in accordance with example implementations, the subsystem 220 receives an initially-determined (see block 202) depth domain elastic model. It is noted that this model may be estimated using, for example, angle gathers derived from the actual seismic measurements 236 (i.e., the migrated depth image I gathers) and the velocity model 206. On the first iteration, the subsystem 220 stores the initial depth domain elastic model 202 as a current elastic model 224. The subsystem 220 performs each iteration using a complex multi-dimensional convolution (block 226) of the impulse responses with the current elastic model 224 reflectivity to produce a synthetically-generated depth image, i.e., a set of current synthetic angle gathers 230. The subsystem 220, in turn, compares (via an adder 232, for example) the current synthetic angle gathers 230 with the angle gathers 236 to determine an inversion model update 234. In accordance with some implementations, based on the inversion model update 234, the subsystem 220 either further modifies the current elastic model 224 or deems that the current elastic model 224 is now the final elastic model 260. If another iteration is performed, the subsystem 220 modifies the current elastic model 224 and proceeds to block 226.

Due to the availability of the well log data for this example, the system 200 may refine the current synthetically-generated angle gathers 230 and/or refine the angle gathers 236, pursuant to block 250. In this regard, using wavelet refinement, the system 220 may determine one or more data corrections 254 to be applied to the gathers 230 and/or 236.

Depending on the particular implementation, the system 200 may be performed by software-based hardware and/or circuitry. Moreover, the system 200 may be implemented using one or more functional modules in an information processing apparatus, such as general purpose processors (Central Processing Units (CPUs), or application specific integrated circuits (ASICs), field programmable gate arrays (FPGAs), programmable logic devices (PLDs), or other appropriate devices, as can be appreciated by the skilled artisan). These modules, combinations of these modules and/or their combination with general hardware are within the scope of the appended claims.

Figure 5:
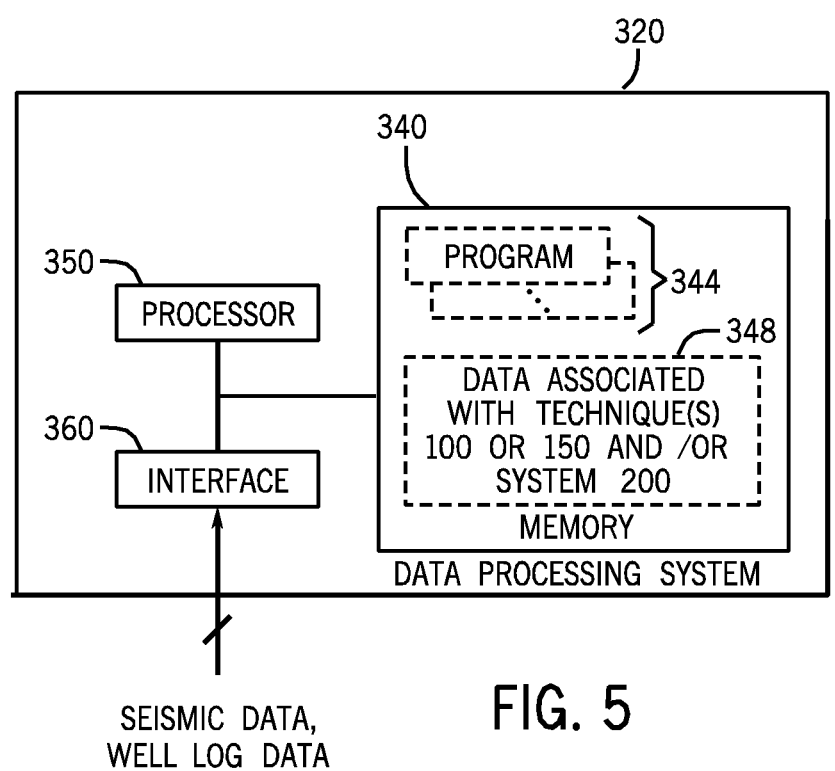
FIG. 5 is a schematic diagram of a data processing system according to an example implementation.

Referring to FIG. 5, in accordance with example implementations, a machine, such as a data processing system 320, may contain a processor 350 for purposes of processing seismic data acquired in a seismic survey of a subsurface geologic region for purposes of determining an elastic model for the region. Depending on the particular implementation, the processor 350 may be formed from one or more microprocessors and/or microprocessor processing cores and thus, may itself be formed from multiple processors. As non-limiting examples, the processor 350 may be disposed at the well 30/seismic survey site (see FIG. 1), or may be disposed at a remote site. Moreover, the data processing system 320 may be a distributed processing system, in accordance with example implementations.

As depicted in FIG. 5, the processor 350 may be coupled to a communication interface 360 for purposes of receiving seismic trace data, well log data, parameters of a velocity model for the subsurface geologic region of interest, data of one or more parameters of an initial estimate for the elastic model, one or more parameters regulating the migration operation, one or more parameters regulating the modeling operation, one or more parameters regulating the determination and/or interpolation of the impulse responses, and so forth. As non-limiting examples, the communication interface 360 may be a Universal Serial Bus (USB) interface, a network interface, a removable media interface (a flash card-compliant interface, Compact Disc-Read Only Memory (CD-ROM)-compliant interface, and so forth) or a magnetic storage interface (Integrated Device Electronics (IDE)-compliant interface or a Small Computer System Interface (SCSI)-compliant interface, as non-limiting examples). Thus, the communication interface 360 may take on numerous forms, depending on the particular implementation.

In accordance with example implementations, the processor 350 is coupled to a memory 340, which stores instructions for one or multiple programs 344, which represent machine executable instructions that when executed by the processor 350, cause the processor 350 to perform various tasks of one or more of the techniques and system that are disclosed herein, such as the technique 100, the technique 150 and/or one or more parts of the system 200. As a non-limiting example, in accordance with some implementations, one or more of the program instructions 344, when executed by the processor 350, may cause the processor 350 to determine point spread functions, interpolate point spread functions, perform migration, perform modeling, determine a depth image from acquired seismic data, perform complex multi-dimensional convolution of point spread functions with an elastic model estimate to determine a synthetically-generated depth image, compare actual and synthetically-generated depth images for purposes of refining an elastic model, determine parameters of an elastic model, determine initial parameters of the elastic model, refine the parameters of the elastic model based on comparisons of actual and synthetically-depth images, compare images other than images in the depth domain, correct depth images using well log data, and so forth.

In particular, the processor 350 may execute the instructions 344 which cause the processor 350 to determine at least one impulse response of a modeling and migration of at least one point scatterer for a subsurface geologic region of interest and based at least in part on the impulse response(s) and a reflection amplitude image of the region, determine an elastic model for the region In general, the memory 340 is a non-transitory memory and may take on numerous forms, such as (as non-limiting example) semiconductor storage, magnetic storage, optical storage, phase change memory storage, capacitor-based storage, and so forth, depending on the particular implementation. Moreover, the memory 340 may be formed from more than one of these non-transitory memories, in accordance with further implementations. When executing one or more of the program instruction 344, the processor 350 may store preliminary, intermediate and/or final results obtained via the execution of the instructions 344 as data 348 that may be stored in the memory 340.

It is noted that the data processing system 320 is merely an example of one out of many possible architectures in accordance with the techniques and systems that are disclosed herein. Moreover, the data processing system 320 is represented in a simplified form, as the processing system 320 may have various other components (a display to display initial, intermediate and/or final results of the system's processing, as non-limiting examples) as can be appreciated by the skilled artisan. Thus, many variations are contemplated, which are within the scope of the appended claims.

Other variations are contemplated and are within the scope of the appended claims. For example, in accordance with example implementations, the target structure may be a non-geologic structure, human tissue, and so forth. Thus, in general, methods and systems are disclosed herein to determine at least one impulse response of a modeling and migration of at least one point scatterer for a target structure and determine a model for at least part of the target structure based at least in part on the impulse response(s) and a reflection amplitude image.

While a limited number of examples have been disclosed herein, those skilled in the art, having the benefit of this disclosure, will appreciate numerous modifications and variations therefrom. It is intended that the appended claims cover all such modifications and variations.

What is claimed is:

1. A method comprising:
receiving an angle gather depth domain migrated image of a seismic survey that comprises an acquisition geometry;
computing impulse responses as point spread functions using the acquisition geometry and a grid of scattering points, wherein the point spread functions account for non-ideal effects of the acquisition geometry;
representing an angle gather synthetic depth domain migrated image as being dependent on the point spread functions and a multidimensional depth domain elastic model of a portion of the Earth, wherein the representing comprises interpolating the point spread functions and convolving the multidimensional depth domain elastic model with the interpolated point spread functions; and
performing an inversion for the multidimensional depth domain elastic model of the portion of the Earth wherein the inversion comprises determining a difference between the angle gather depth domain migrated image and the represented angle gather synthetic depth domain migrated image.

2. The method of claim 1 comprising constructing an initial multidimensional depth domain elastic model of a portion of the Earth prior to performing the inversion.

3. The method of claim 1 wherein the multidimensional depth domain elastic model of the portion of the Earth comprises velocity and anisotropy parameters.

4. The method of claim 3 wherein the velocity parameters comprise at least one compression velocity (vp) parameter or shear velocity (vs) parameter.

5. The method of claim 3 wherein the anisotropy parameters comprise at least one Thomsen parameter.

6. The method of claim 1 comprising displaying the multidimensional depth domain elastic model of the portion of the Earth.

7. The method of claim 1 comprising using the multidimensional depth domain elastic model of the portion of the Earth to determine structural information for a subsurface geologic region of interest.

8. A system comprising:
a processor;
memory;
processor-executable instructions stored in the memory and executable to instruct the system to:
receive an angle gather depth domain migrated image of a seismic survey that comprises an acquisition geometry;
compute impulse responses as point spread functions using the acquisition geometry and a grid of scattering points, wherein the point spread functions account for non-ideal effects of the acquisition geometry;
represent an angle gather synthetic depth domain migrated image as being dependent on the point spread functions and a multidimensional depth domain elastic model of a portion of the Earth, wherein the representation comprises interpolation of the point spread functions and convolution of the multidimensional depth domain elastic model with the interpolated point spread functions; and
perform an inversion for the multidimensional depth domain elastic model of the portion of the Earth wherein the inversion determines a difference between the angle gather depth domain migrated image and the represented angle gather synthetic depth domain migrated image.

9. The system of claim 8 comprising processor-executable instructions to construct an initial multidimensional depth domain elastic model of a portion of the Earth prior to the performance of the inversion.

10. The system of claim 8 wherein the multidimensional depth domain elastic model of the portion of the Earth comprises velocity and anisotropy parameters.

11. The system of claim 10 wherein the velocity parameters comprise at least one compression velocity (vp) parameter or shear velocity (vs) parameter.

12. The system of claim 10 wherein the anisotropy parameters comprise at least one Thomsen parameter.

13. The system of claim 8 comprising processor-executable instructions to display the multidimensional depth domain elastic model of the portion of the Earth.

14. The system of claim 8 comprising processor-executable instructions to use the multidimensional depth domain elastic model of the portion of the Earth to determine structural information for a subsurface geologic region of interest.

15. A non-transitory storage medium that stores instructions executable by a processor-based machine to cause the processor-based machine to:
receive an angle gather depth domain migrated image of a seismic survey that comprises an acquisition geometry;
compute impulse responses as point spread functions using the acquisition geometry and a grid of scattering points, wherein the point spread functions account for non-ideal effects of the acquisition geometry;
represent an angle gather synthetic depth domain migrated image as being dependent on the point spread functions and a multidimensional depth domain elastic model of a portion of the Earth, wherein the representation comprises interpolation of the point spread functions and convolution of the multidimensional depth domain elastic model with the interpolated point spread functions; and
perform an inversion for the multidimensional depth domain elastic model of the portion of the Earth wherein the inversion determines a difference between the angle gather depth domain migrated image and the represented angle gather synthetic depth domain migrated image.

\* \* \* \* \*